United States Patent
Kang

(10) Patent No.: US 9,396,985 B2
(45) Date of Patent: Jul. 19, 2016

(54) ELEMENT ISOLATION STRUCTURE OF SEMICONDUCTOR AND METHOD FOR FORMING THE SAME

(75) Inventor: Yang-Beom Kang, Chungcheongbuk-Do (KR)

(73) Assignee: MAGNACHIP SEMICONDUCTOR, LTD., Chungbuk (KR)

( * ) Notice: Subject to any disclaimer, the term of this patent is extended or adjusted under 35 U.S.C. 154(b) by 318 days.

(21) Appl. No.: 13/039,211

(22) Filed: Mar. 2, 2011

(65) Prior Publication Data

US 2012/0018840 A1 Jan. 26, 2012

(30) Foreign Application Priority Data

Jul. 20, 2010 (KR) .................... 10-2010-0070198

(51) Int. Cl.
*H01L 29/06* (2006.01)
*H01L 21/762* (2006.01)

(52) U.S. Cl.
CPC ................................ *H01L 21/76232* (2013.01)

(58) Field of Classification Search
CPC ................................................ H01L 21/76232
USPC ......... 438/400, 405, 221, 359, 295–296, 361, 438/424–430; 257/508, E29.02, 395–397, 257/510–513
See application file for complete search history.

(56) References Cited

U.S. PATENT DOCUMENTS

| | | | | |
|---|---|---|---|---|
| 4,472,240 A * | 9/1984 | Kameyama | .................... | 438/427 |
| 4,533,932 A * | 8/1985 | Kondo | ......................... | 257/369 |
| 4,577,395 A * | 3/1986 | Shibata | ......................... | 438/386 |
| 4,579,812 A * | 4/1986 | Bower | ........................... | 430/313 |
| 4,882,291 A * | 11/1989 | Jeuch | ............................. | 438/424 |
| 6,110,797 A | 8/2000 | Perry et al. | | |
| 6,137,152 A * | 10/2000 | Wu | ................................ | 257/510 |
| 6,187,685 B1 * | 2/2001 | Hopkins et al. | ............... | 438/710 |
| 6,294,419 B1 * | 9/2001 | Brown et al. | .................. | 438/221 |
| 6,383,877 B1 * | 5/2002 | Ahn et al. | ..................... | 438/296 |

(Continued)

FOREIGN PATENT DOCUMENTS

| | | |
|---|---|---|
| CN | 101710575 A | 5/2010 |
| KR | 1020070093535 | 9/2007 |
| KR | 1020100020792 | 2/2010 |

*Primary Examiner* — Ori Nadav

(74) *Attorney, Agent, or Firm* — Blakely Sokoloff Taylor & Zafman LLP

(57) ABSTRACT

Disclosed are an element isolation structure of a semiconductor device and a method for forming the same, the method including preparing a semiconductor substrate having an inactive region and an active region defined thereon, forming a first hard mask on the semiconductor substrate, exposing the inactive region of the semiconductor substrate by patterning the first hard mask, forming a second hard mask on the entire surface of the semiconductor substrate including the first hard mask, forming a deep trench in the semiconductor substrate by patterning the second hard mask and the semiconductor substrate, removing the patterned second hard mask, forming a shallow trench overlapped with the deep trench by patterning the semiconductor substrate using the first hard mask as a mask, forming an insulation film on the entire surface of the substrate including the shallow trench and the deep trench, filling the shallow trench and the deep trench by forming an element isolation film on the insulation film, and forming an element isolation film pattern in the deep trench and the shallow trench by selectively removing the element isolation film.

12 Claims, 20 Drawing Sheets

(56) References Cited

U.S. PATENT DOCUMENTS

| | | | |
|---|---|---|---|
| 6,383,899 B1 * | 5/2002 | Voutsas | 438/486 |
| 6,800,532 B2 * | 10/2004 | Ohnishi et al. | 438/314 |
| 7,078,324 B2 * | 7/2006 | Dudek et al. | 438/524 |
| 7,323,379 B2 * | 1/2008 | Sinitsky et al. | 438/210 |
| 7,358,596 B2 * | 4/2008 | Akram | 257/647 |
| 7,648,869 B2 * | 1/2010 | Chang et al. | 438/199 |
| 7,655,985 B2 * | 2/2010 | Furukawa et al. | 257/372 |
| 2006/0172504 A1 * | 8/2006 | Sinitsky et al. | 438/381 |
| 2006/0267134 A1 * | 11/2006 | Tilke et al. | 257/519 |

* cited by examiner

STI DEPTH(D):<4000Å    STI DEPTH(D):>4000Å

ELEMENT ISOLATION STRUCTURE OF SEMICONDUCTOR AND METHOD FOR FORMING THE SAME

CROSS-REFERENCE TO RELATED APPLICATION

Pursuant to 35 U.S.C. §119(a), this application claims the benefit of earlier filing date and right of priority to Korean Application No. 10-2010-0070198, filed on Jul. 20, 2010, the contents of which is incorporated by reference herein in its entirety.

BACKGROUND OF THE INVENTION

1. Field of the Invention

The present disclosure relates to an element isolation of a semiconductor device, and particularly, to an element isolation structure of a semiconductor, capable of forming an element isolation structure by using a deep trench and a shallow trench without any defect, and a method for forming the same.

2. Background of the Invention

Recently, element isolations for high voltage devices, among semiconductor devices, are divided into a junction isolation method and a deep trench isolation method. In recent time, the element isolation is achieved by the deep trench isolation for size reduction and improvement of isolation characteristics. For devices using an isolation technique below 0.25 μm CMOS design rule, trenches of a high voltage device and a low voltage device have different trench depths, so a dual-depth trench having a deep trench and a shallow trench should be formed.

A method of forming an element isolation structure of a semiconductor device, in which a shallow trench is formed after forming a deep trench is formed, will be described with reference to FIGS. 1A to 1I.

FIGS. 1A to 1I are sectional views showing sequential processes of a method for forming an element isolation structure of a semiconductor device according to the related art.

Referring to FIG. 1A, a semiconductor substrate 11 having an inactive region and an active region is sequentially deposited with a pad oxide 13 and a pad nitride 15, and then a first photosensitive film 17 is coated on the pad nitride 15.

Referring to FIG. 1B, the first photosensitive film 17 is patterned through a photolithography process using a mask (not shown) via an exposure and development process, thereby forming first photosensitive film patterns 17a.

Referring to FIG. 1C, the pad nitride 15, the pad oxide 13 and the semiconductor substrate 11 are sequentially etched out by using the first photosensitive film patterns 17a as masks, thereby forming a deep trench 21 into the semiconductor substrate 11.

Referring to FIG. 1D, after removing the first photosensitive film patterns 17a, a second photosensitive film 23 is coated on the pad nitride 15 including the deep trench 21, thereby filling the deep trench 21.

Referring to FIG. 1E, the second photosensitive film 23 is exposed by irradiating ultraviolet rays 27 on the second photosensitive film 23 through a photolithography process using masks 25. Here, upon exposure of the second photosensitive film 23, the exposed portion of the second photosensitive film 23 is physically transformed. However, the depth of the deep trench 21 may interrupt the exposure of the entire second photosensitive film 23 present within the deep trench 21, and accordingly a bottom portion 23a of the second photosensitive film 23 remains unexposed.

Referring to FIG. 1F, the exposed portion 23b (see FIG. 1E) of the second photosensitive film 23 is melted by a development solution but the unexposed portion 23a of the second photosensitive film 23 is not melted thereby. The exposed portion 23b of the second photosensitive film 23 is melted out through the development process, but the unexposed portion 23b of the second photosensitive film 23 on the bottom of the deep trench 21 still remains unexposed.

Referring to FIG. 1G, the pad nitride 15, the pad oxide 13 and the semiconductor substrate 11 are sequentially etched out by using the remaining second photosensitive film 23 without being removed as a barrier layer, thereby forming a shallow trench 31 in the semiconductor substrate 11. Here, during the etching process, the remaining portion 23a of the second photosensitive film 23 on the bottom of the deep trench 21 may interrupt the etching, thereby causing the peripheral portion of the remaining second photosensitive film portion 23a to be etched out, resulting in the generation of notches 33.

Afterwards, the second photosensitive film 23 and the remaining photosensitive film portion 23a on the bottom of the deep trench 21 are removed.

Referring to FIG. 1H, sidewalls of the deep trench 21 and the shallow trench 31 are oxidized so as to form an oxide 35 on the sidewalls. Here, growing of the oxide 35 allows overcoming of a defect on the semiconductor substrate 11 present on the trench sidewalls.

Still referring to FIG. 1H, a filling oxide 37 is formed on an entire surface of the substrate including the deep trench 21 and the shallow trench 31, thereby filling both the deep and shallow trenches 21 and 31.

Referring to FIG. 1I, the filling oxide 37 present outside the deep and shallow trenches 21 and 31 is planarized through a chemical mechanical polishing (CMP) process, thereby forming a filling oxide pattern 37a within the deep and shallow trenches 21 and 31. Here, the filling oxide pattern 37a constructs an element isolation structure 10, which includes a deep trench region 10b and a shallow trench region 10a.

Although not shown, the pad nitride 15 may selectively be removed so as to complete a process of forming the element isolation structure 10 of the semiconductor device.

However, the method of forming the element isolation structure of the semiconductor device according to the related art has several problems as follows.

According to the related art method of forming the element isolation structure, when the deep trench is first formed, it may be possible to remove an undercut portion during a shallow trench etching process. However, a defective coating may be caused during a photolithography process for forming the shallow trench, resulting in giving rise to a problem during the pattern forming process. That is, upon exposure of the photosensitive film, the exposed portion of the photosensitive film is physically transformed but the depth of the deep trench may interrupt the exposure of the entire photosensitive film within the deep trench. Consequently, the bottom portion of the photosensitive film may remain unexposed. As a result, the exposed portion of the photosensitive film is melted out by a development solution through a development process but the unexposed portion of the photosensitive film present on the bottom of the deep trench remains unexposed.

The remaining portion of the photosensitive film may interrupt etching during the following etching process of forming the shallow trench, which causes the peripheral portion of the remaining photosensitive film portion to be etched out, thereby generating the notches.

Also, according to the related art method of forming the element isolation structure, when coating the photosensitive film for forming the shallow trench after forming the deep trench, since the photosensitive film is coated by a spin coating, a sufficient gap-filling is not made. Accordingly, a void is generated, thereby causing a defective coating. That is, since the deep trench is extremely deep in depth, the defective coating such as the void is caused, whereby a material such as the photosensitive film (PR) is not evenly filled up to the top of the entire substrate.

SUMMARY OF THE INVENTION

Therefore, to address those problems of the related art, an object of the present disclosure is to provide an element isolation structure of a semiconductor device, capable of ensuring stable device characteristics by overcoming (minimizing) several problems, namely, a remaining photosensitive film caused when forming a shallow trench overlapped with a deep trench, a defective gap-filling due to defective coating, such as a void, and the like, and a method for forming the same.

To achieve these and other advantages and in accordance with the purpose of the present disclosure, as embodied and broadly described herein, there is provided an element isolation structure of a semiconductor device including a semiconductor substrate having an inactive region and an active region defined thereon, a deep trench formed in the inactive region of the semiconductor substrate, a shallow trench formed in the inactive region of the semiconductor substrate and overlapped with the deep trench, an oxide and a first element isolation film pattern both formed in the deep trench, and a second element isolation film pattern formed in the shallow trench and contactable with the first element isolation film pattern.

In accordance with one exemplary embodiment, there is provided a method including preparing a semiconductor substrate having an inactive region and an active region defined thereon, forming a first hard mask on the semiconductor substrate, exposing the inactive region of the semiconductor substrate by patterning the first hard mask, forming a second hard mask on the entire surface of the semiconductor substrate including the first hard mask, forming a deep trench in the semiconductor substrate by patterning the second hard mask and the semiconductor substrate, removing the patterned second hard mask, forming a shallow trench overlapped with the deep trench by patterning the semiconductor substrate using the first hard mask as a mask, forming an insulation film on the entire surface of the substrate including the shallow trench and the deep trench, filling the shallow trench and the deep trench by forming an element isolation film on the insulation film, and forming an element isolation film pattern in the deep trench and the shallow trench by selectively removing the element isolation film.

An element isolation structure of a semiconductor device and a method for forming the same may provide the following effects.

According to the element isolation structure of the semiconductor device and the method of forming the same, poly stringers, which are caused due to separate formation of the shallow trench and the deep trench, can be minimized by forming the deep trench within the shallow trench.

Also, according to the element isolation structure of the semiconductor device and the method of forming the same, the shallow trench can be formed after forming the deep trench, thereby minimizing an undercut of the top of the deep trench occurred upon forming the deep trench and the thusly-caused surface roughness of the trench sidewalls.

According to the element isolation structure of the semiconductor device and the method of forming the same, only the hard mask is etched out after completion of the element isolation structure forming process, and then the etching process for the deep trench is executed, thereby eliminating a defective coating of a photosensitive film, which would otherwise result from forming the shallow trench after forming the deep trench.

Furthermore, according to the element isolation structure of the semiconductor device and the method of forming the same, the existing process of coating the photosensitive film for forming the shallow trench after forming the deep trench can be omitted, resulting in solving of a problem of a defective coating, such as a void, caused due to insufficient gap-filling within the deep trench when coating the photosensitive film by the existing spin coating.

In addition, according to the element isolation structure of the semiconductor device and the method of forming the same, since the process of forming the photosensitive film for forming the shallow trench can be omitted, a stable dual-depth trench having the deep trench and the shallow trench overlapped with the deep trench can be formed, thereby ensuring characteristics of stable isolation and operation of a high voltage device.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of an element isolation structure of a semiconductor device and a method for forming the same in accordance with exemplary embodiments according to the present disclosure, with reference to the accompanying drawings. For the sake of brief description with reference to the drawings, the same or equivalent components will be provided with the same reference numbers, and description thereof will not be repeated.

Figure 1A:
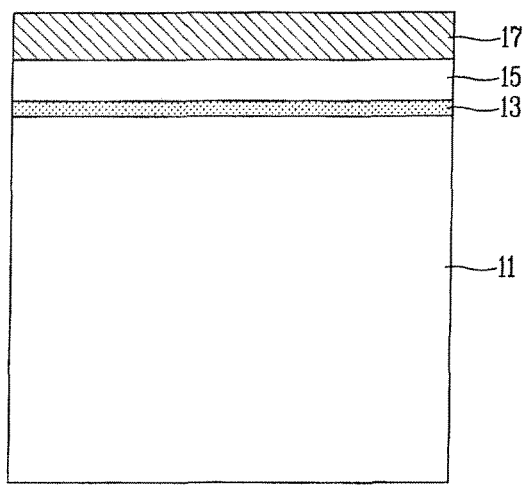
FIGS. 1A to 1I are sectional views showing sequential processes of a method for forming an element isolation structure of a semiconductor device according to the related art.
Figure 1B:
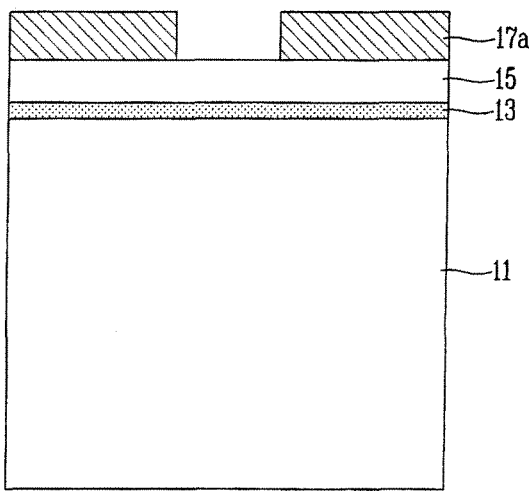
Figure 1C:
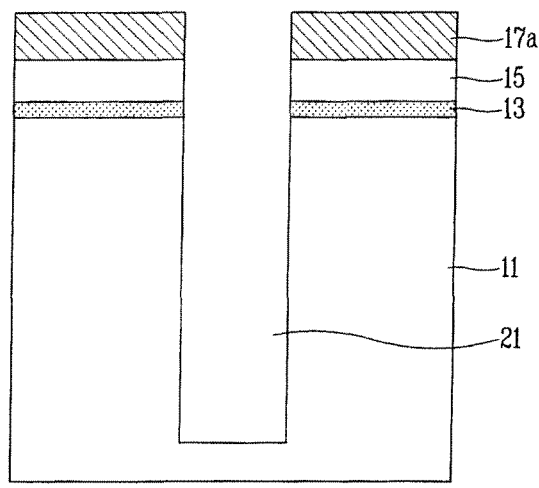
Figure 1D:
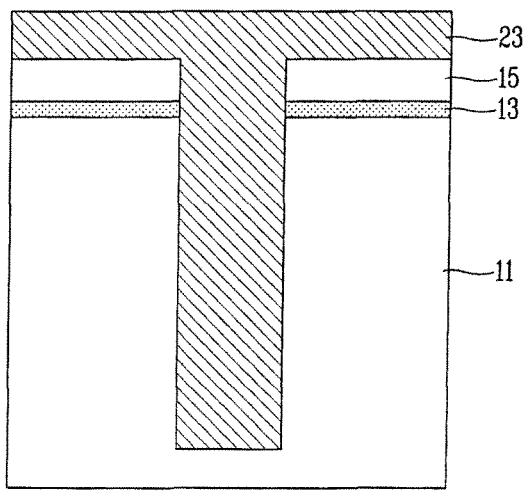
Figure 1E:
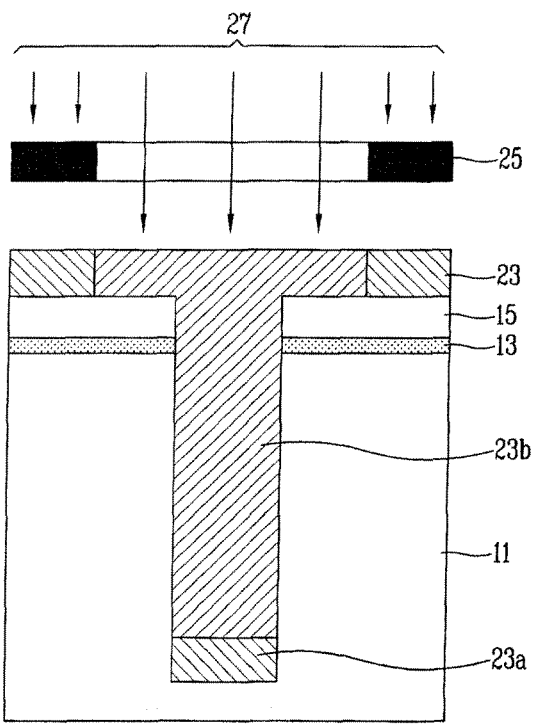
Figure 1F:
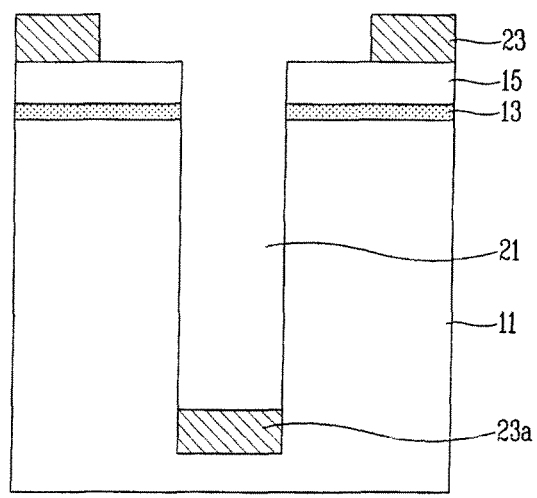
Figure 1G:
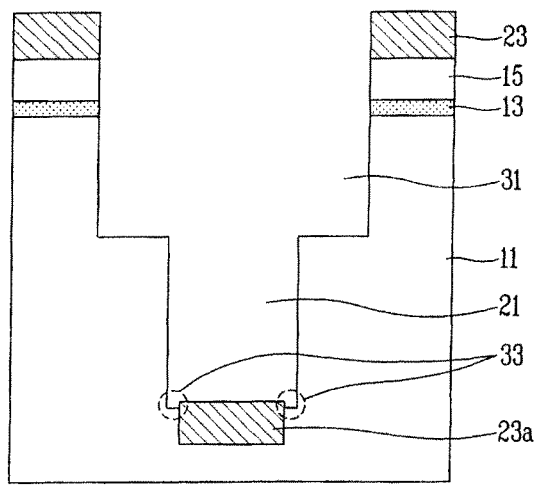
Figure 1H:
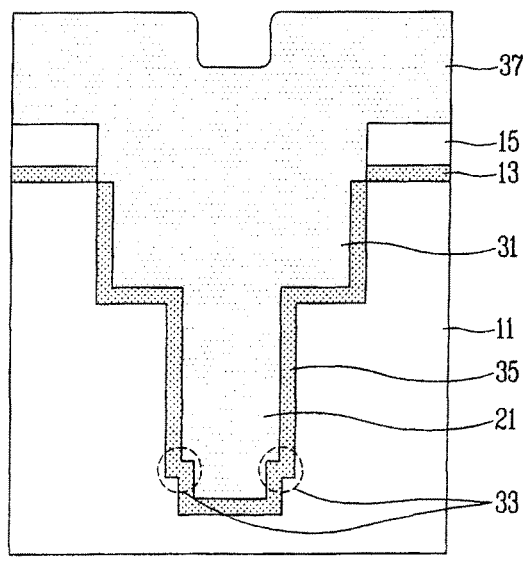
Figure 1I:
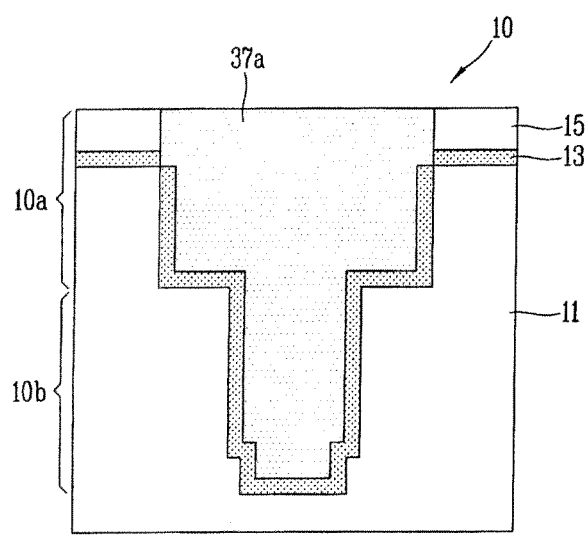
Figure 2:
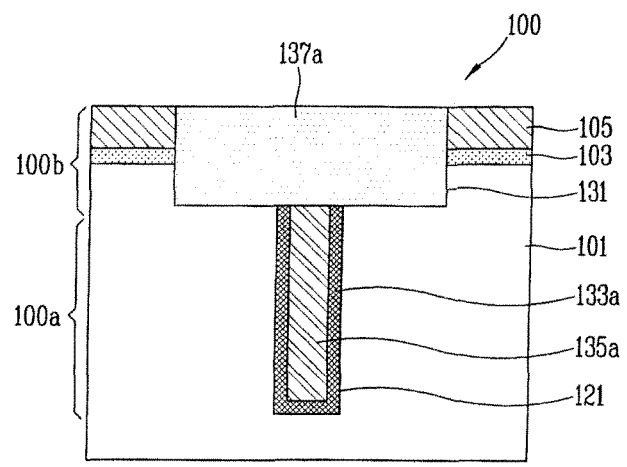
FIG. 2 is a sectional view of an element isolation structure of a semiconductor device in accordance with the present disclosure.

FIG. 2 is a sectional view of an element isolation structure of a semiconductor device in accordance with the present disclosure.

An element isolation structure 100 of a semiconductor device, as shown in FIG. 2, may include a semiconductor substrate 101 having an inactive region and an active region defined thereon, a deep trench 121 formed in the semiconductor substrate 101, a shallow trench 131 formed in the semiconductor substrate 101 and overlapped with the deep trench 121, an oxide pattern 133a and a polysilicon film pattern 135a formed within the deep trench 121, and a chemical vapor deposition (CVD) oxide pattern 137a formed within the shallow trench 131 and contactable with the polysilicon film pattern 135a.

Here, the element isolation structure 100 may be provided with a deep trench region 100a and a shallow trench region 100b. The deep trench region 100a may be provided with the oxide pattern 133a and the polysilicon film pattern 135a, and the shallow trench region 100b may be provided with the CVD oxide pattern 137a.

Hereinafter, description will be given of a method for forming an element isolation structure of a semiconductor device having the construction with reference to FIGS. 3A to 3N.

Figure 3A:
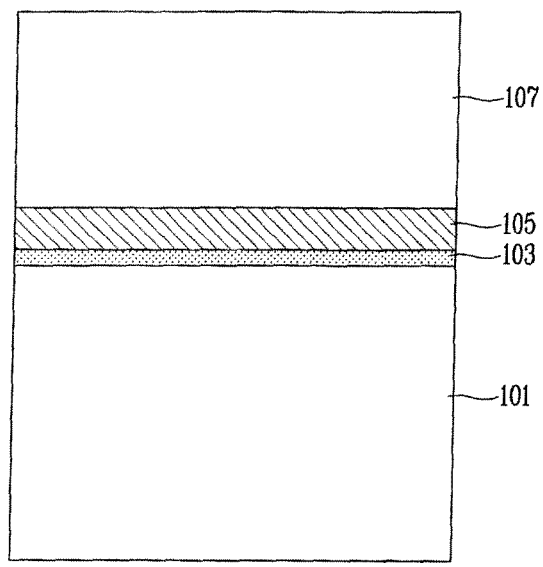
FIGS. 3A to 3N are sectional views illustrating sequential processes of a method for forming an element isolation structure of a semiconductor device in accordance with one exemplary embodiment.
Figure 3B:
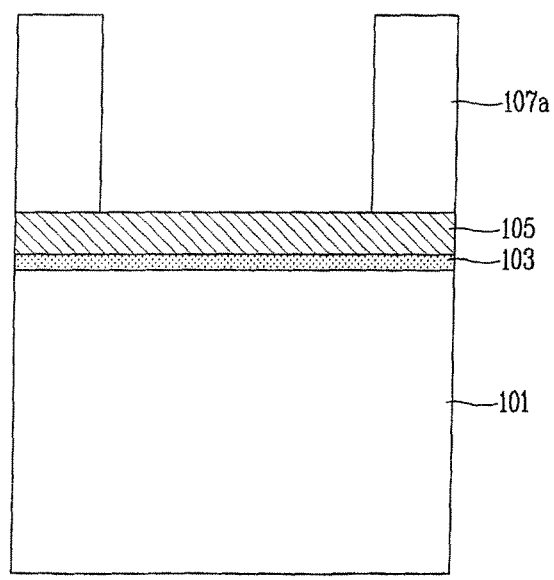
Figure 3C:
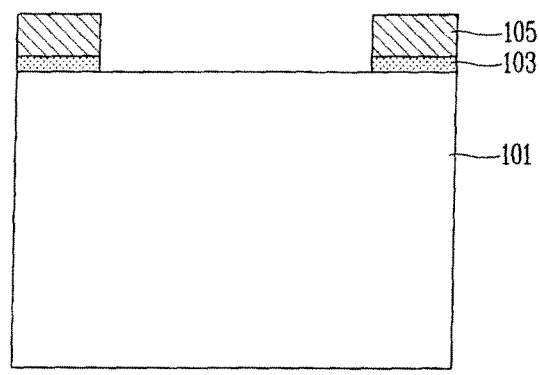
Figure 3D:
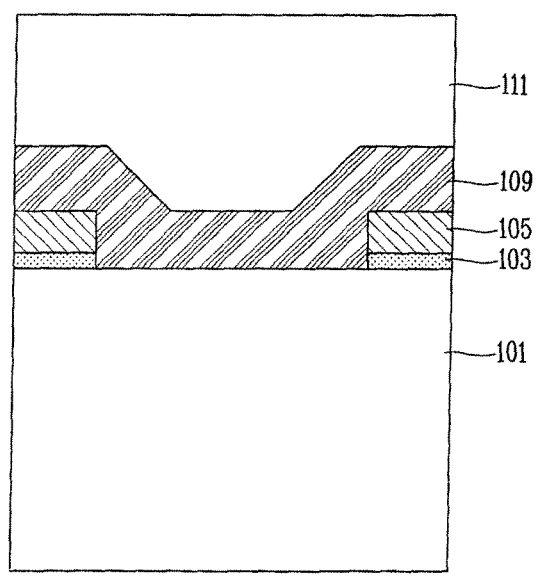
Figure 3E:
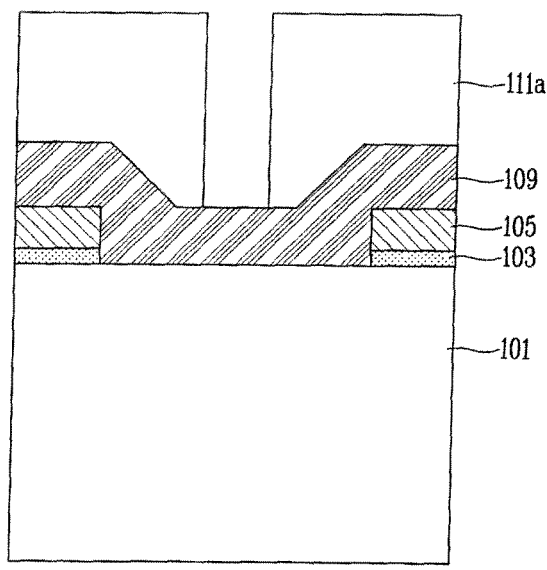
Figure 3F:
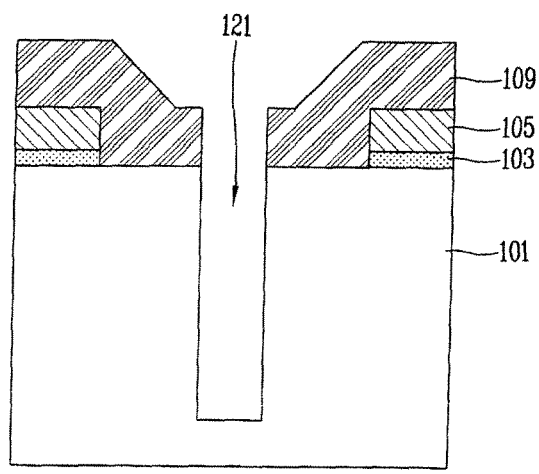
Figure 3G:
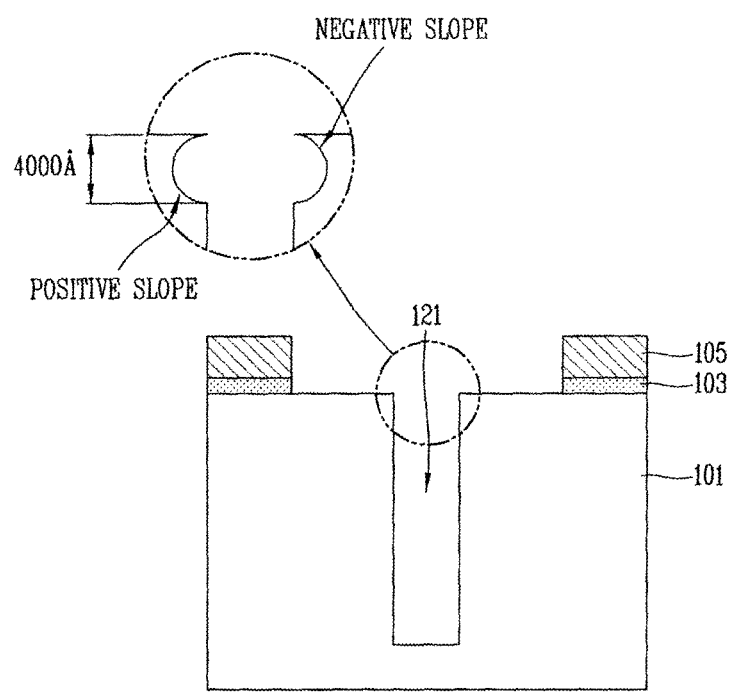
Figure 3H:
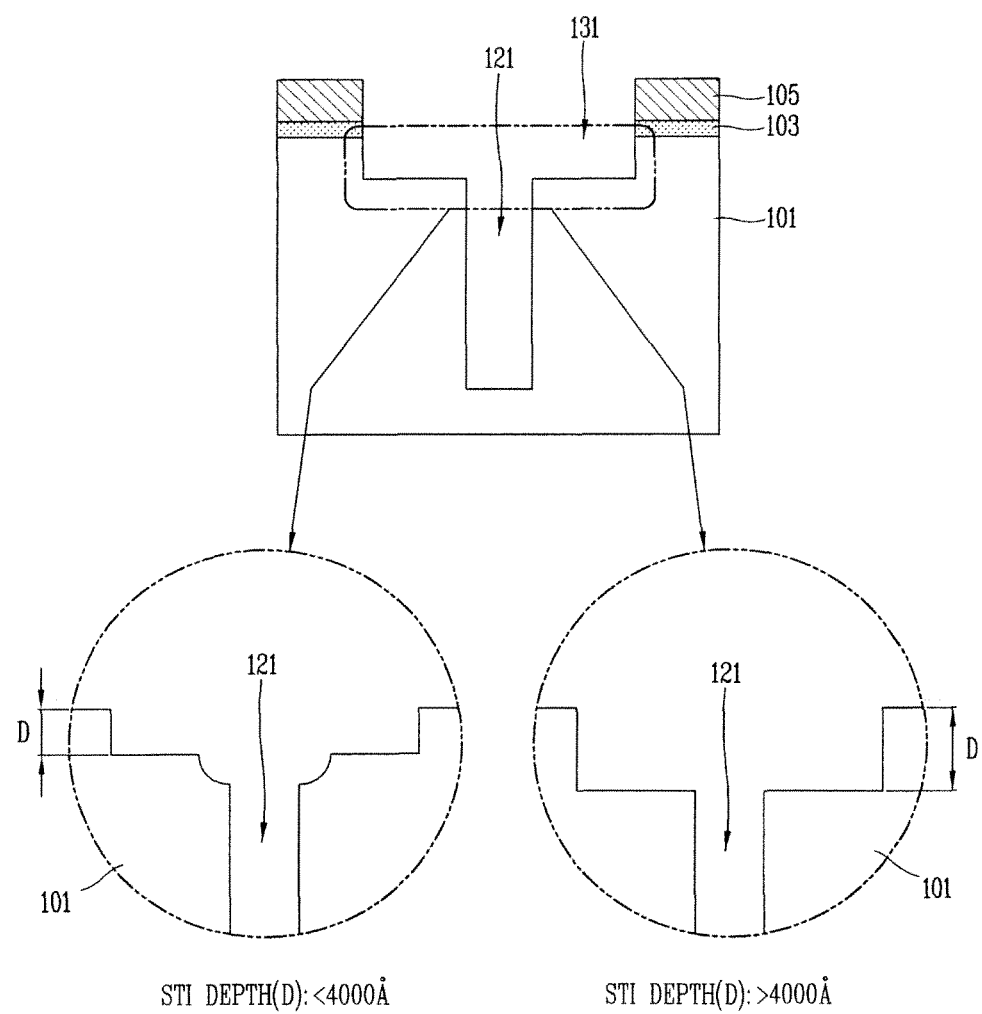
Figure 3I:
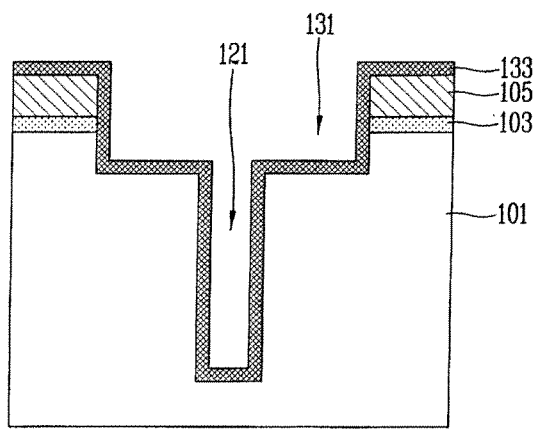
Figure 3J:
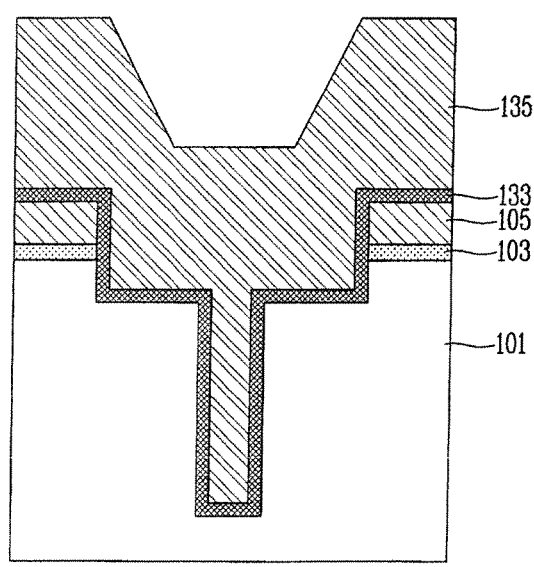
Figure 3K:
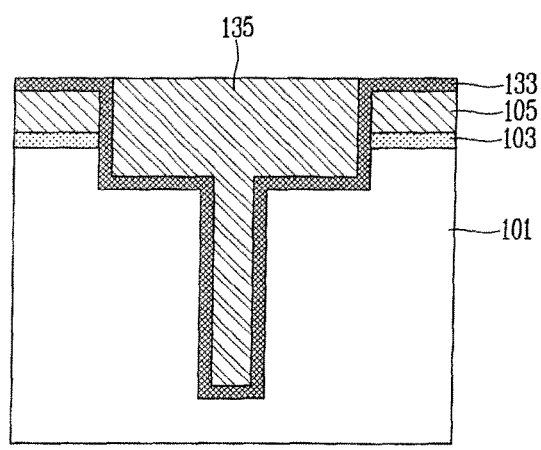
Figure 3L:
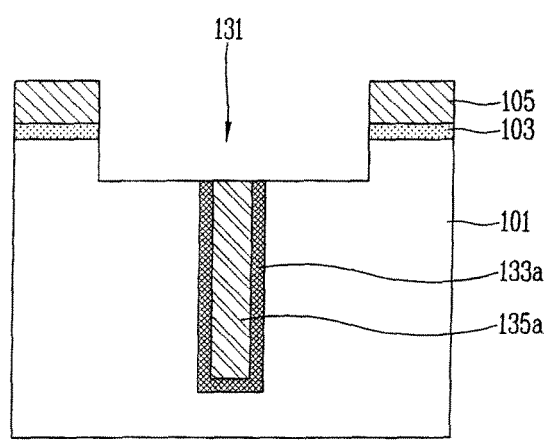
Figure 3M:
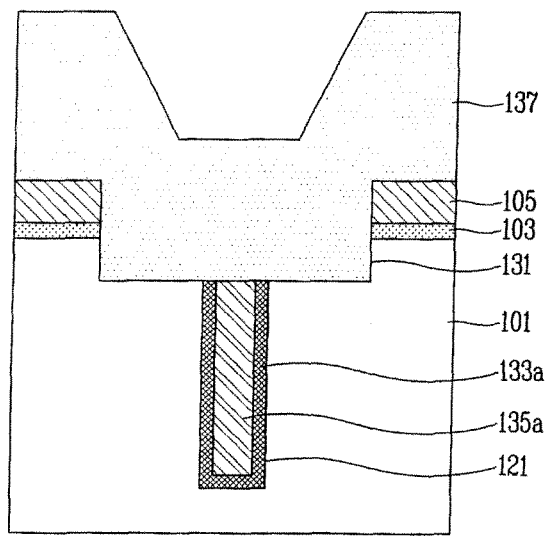
Figure 3N:
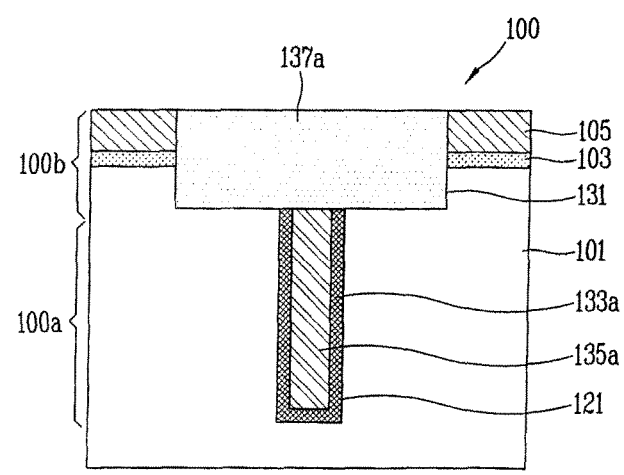

FIGS. 3A to 3N are sectional views illustrating sequential processes of a method for forming an element isolation structure of a semiconductor device in accordance with one exemplary embodiment.

Referring to FIG. 3A, a pad oxide 103 and a pad silicon nitride 105 are sequentially deposited on the semiconductor substrate 101 having an inactive region and an active region defined thereon, and a first photosensitive film 107 is coated on the pad silicon nitride 105. Here, the pad oxide 103 and the pad silicon nitride 105 may be used as a first hard mask physical layer. Also, the thickness of the first hard mask physical layer is far shallower than the depth of the deep trench, which can be understood as the likelihood of a defective coating is low.

Referring to FIG. 3B, the first photosensitive film 107 is exposed and developed through a photolithography process using exposure masks (not shown), and the developed portion is removed, thereby forming first photosensitive film patterns 107a.

Referring to FIG. 3C, the pad silicon nitride 105 and the pad oxide 103 constructing a first hard mask are etched out by using the first photosensitive film patterns 107a as barrier layers, and thereafter the first photosensitive film patterns 107a are removed. Here, the etching is conducted down to the pad silicon nitride 105 and the pad oxide 103 constructing the first hard mask, so as to overcome the problem of a defective photosensitive film coating, which is caused when performing an etching process for forming a shallow trench after the etching process for forming the deep trench. That is, to define a shallow trench forming region through the first hard mask etching process and then perform the process of forming the shallow trench using the pad silicon nitride 105 constructing the first hard mask without a photolithography process after the etching process for forming the deep trench.

Referring to FIG. 3D, after removing the first photosensitive film patterns 107a, a second hard mask oxide 109 is deposited, in a thickness of about 0.5 to 1.5∝µ, on the entire surface of the semiconductor substrate 101, including the exposed portions of the pad silicon nitride 105 and the pad oxide 103 constructing the first hard mask, through a chemical vapor deposition (CVD) having satisfactory gap-filling properties. Here, the second hard mask oxide 109 may be deposited to cover the tops of the pad silicon nitride 105 and the pad oxide 103 constructing the first hard mask, whereby the first hard mask can be protected upon forming the deep trench.

Afterwards, a second photosensitive film 111 is coated on the second hard mask oxide 109.

Referring to FIG. 3E, the second photosensitive film (not shown) is exposed for formation of deep trench and developed through a photolithography process using exposure masks (not shown), thereby forming second photosensitive film patterns 111a by removing the developed portion.

Referring to FIG. 3F, the second hard mask oxide 109 and the lower semiconductor substrate 101 are sequentially etched out by using the second photosensitive film patterns 111a as masks, thereby forming a deep trench 121 in the semiconductor substrate 101. Here, the deep trench 121 may have a depth of about 1 to 20 µm.

Referring to FIG. 3G, after removing the second photosensitive film patterns 111a, the second hard mask oxide 109 is etched out through a wet etching process. Here, only the pad silicon nitride 105 and the pad oxide 103 constructing the first hard mask are left on the semiconductor device 101. According to FIG. 3G, the deep trench 121 may form an undercut from a top surface of the semiconductor substrate 101 to a depth of 4000 Å. The undercut is formed to round shape. Here, an upper portion of the undercut has a negative slope, while a low portion of the undercut has a positive slope.

Referring to FIG. 3H, the semiconductor substrate 101 is selectively removed by using the pad silicon nitride 105 and the pad oxide 103 for the first hard mask as etching masks, thereby forming a shallow trench 131 overlapped with the deep trench 121. Here, a depth D of shallow trench is 3000 to 5000 Å. As recited above, the deep trench 121 forms an undercut from a top surface of the semiconductor substrate 101 to a depth of 4000 Å. If the shallow trench depth D is more than 4000 Å, the formation of the shallow trench 131 may remove undercut existing from a top of the deep trench 121 down to about 4000 Å in depth and the resulting surface roughness of a sidewall of the deep trench 121.

That is, while forming the deep trench 121, even if any undercut is generated on a top sidewall, the undercut can be completely removed through the process of forming the shallow trench 131.

If the shallow trench depth D is less than 4000 Å, an undercut having a negative slope is removed, and an undercut having a positive slope is only remained. This is because the undercut is formed from the top surface to the depth of 4000 Å, and the shallow trench depth D is formed smaller than the undercut depth so that the entire of the undercut is not removed. Because the undercut having the negative slope formed at a region close to a surface of the semiconductor substrate 101 is removed, it is out of the question in a process depositing for filling a gap. Because a part having the positive slope is remained, the gap fill may be rather better.

Also, while forming the shallow trench 131, a bottom of the deep trench 121 can be further etched out as deep as the depth of the shallow trench 131.

Also, since the existing process of coating the photosensitive film for forming the shallow trench after forming the deep trench is omitted, the problem of defective coating, such as a void, which is caused due to insufficient gap-filling within the deep trench when coating the photosensitive film by a spin coating in the related art, can be solved.

Referring to FIG. 3I, prior to deposition of polysilicon as a gap-fill material, a sidewall oxide 133 is deposited in a thickness of 1000 to 5000 Å through CVD method for electrical floating of the polysilicon. Here, instead of the sidewall oxide, a sidewall nitride may be formed using nitride. Here, the sidewall oxide may be formed for reduction of stress between the semiconductor substrate and the nitride material prior to the nitride deposition. The sidewall oxide may be grown by thermal oxidation.

Referring to FIG. 3J, a polysilicon film 135 as a gap-fill material is deposited in a thickness of about 1 to 2 μm on the sidewall oxide 133, so as to fill the deep trench 121 and the shallow trench 131. Here, CVD oxide other than the polysilicon film may alternatively be used as the gap-fill material.

Referring to FIG. 3K, a chemical mechanical polishing (CMP) process is executed to selectively remove the polysilicon film 135. Here, the sidewall oxide 133 may act as an anti-CMP layer upon the CMP process of the polysilicon film 135, which is available because the polysilicon film 135 and the sidewall oxide 133 have different CMP removal rates. Also, in another embodiment, when the CVD oxide is used as the gap-fill material, nitride may be deposited instead of the sidewall oxide because the nitride having a different CMP removal rate can act as an anti-CMP layer upon CMP process of the oxide.

Referring to FIG. 3L, after completion of the CMP process, an etch-back process is executed to remove the polysilicon film 135 remaining on the region of the shallow trench 131. Here, upon the etch-back process, the sidewall oxide 133 is used as an anti-etching layer by using $Cl_2$/HBr gas having superior etching selection rate for the oxide.

After the etch-back process, the sidewall oxide 133 may be removed through a wet etching. Here, a portion of the sidewall oxide 133 present in the region of the shallow trench 131 is removed and accordingly a portion thereof present in the deep trench 121, namely, only the sidewall oxide pattern 133a, remains.

Referring to FIG. 3M, for isolation of the shallow trench 131, a CVD oxide 137 is deposited on the entire surface of the substrate including the shallow trench 131 through the CVD method, thereby performing gap-filling. The CVD method includes one of high density plasma chemical vapor deposition (HDPCVD), low pressure chemical vapor deposition (LPCVD), plasma enhanced chemical vapor deposition (PECVD), and atmospheric pressure chemical vapor deposition (APCVD) methods. Therefore the shallow trench region is filled with one of isolation layer of HDPCVD, LPCVD, PECVD and APCVD oxide.

Referring to FIG. 3N, the CVD oxide 137 is planarized through a CMP process to form a CVD oxide pattern 137a, and then the remaining first hard mask pad silicon nitride 105 is removed through a wet etching, thereby completing the process of forming the element isolation structure 100. Here, the sidewall oxide pattern 133a and the polysilicon film 135a are filled at the sidewall of and inside a deep trench region 100a constructing the element isolation structure 100. Also, the CVD oxide pattern 137a is filled in a shallow trench region 100b. The CVD oxide pattern 137a is in a contact state with the lower polysilicon film 135a.

Hereinafter, a method for forming an element isolation structure of a semiconductor device in accordance with another exemplary embodiment will be described with reference to FIGS. 4A to 4L.

FIGS. 4A to 4L are sectional views illustrating sequential processes of a method for forming an element isolation structure of a semiconductor device in accordance with another exemplary embodiment.

Figure 4A:
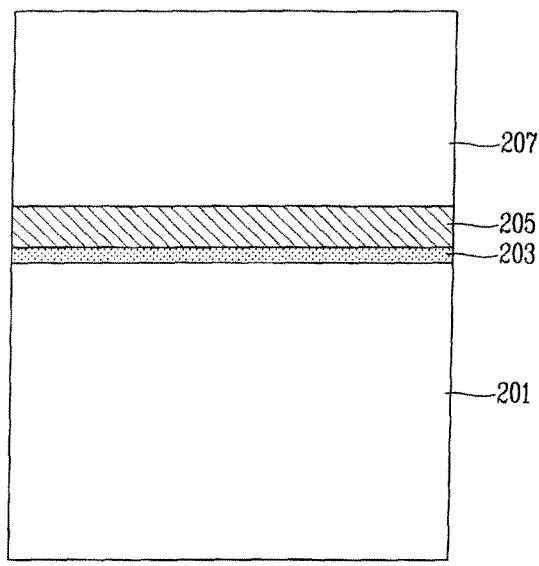
FIGS. 4A to 4L are sectional views illustrating sequential processes of a method for forming an element isolation structure of a semiconductor device in accordance with another exemplary embodiment.

Referring to FIG. 4A, a pad oxide 203 and a pad silicon nitride 205 are sequentially deposited on a semiconductor substrate 201 having an inactive region and an active region defined thereon, and a first photosensitive film 207 is coated on the pad silicon nitride 205. Here, the pad oxide 203 and the pad silicon nitride 205 will be used as a first hard mask physical layer. Also, the thickness of the first hard mask physical layer is far shallower than the depth of the deep trench, which can be understood as the likelihood of a defective coating is low.

Figure 4B:
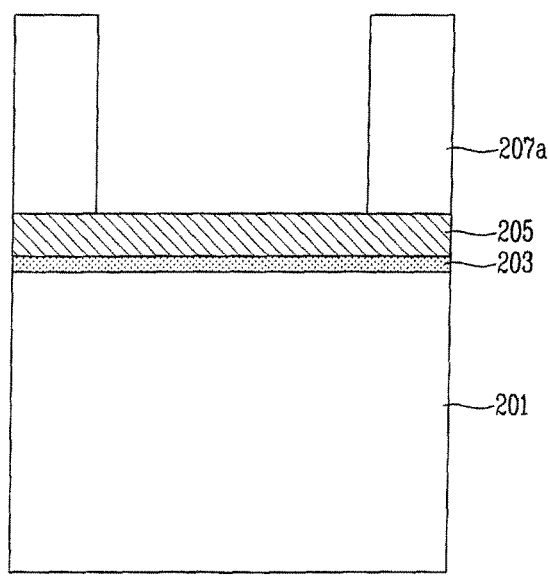

Referring to FIG. 4B, the first photosensitive film 207 is exposed and developed through a photolithography process using exposure masks (not shown), and the developed portion is removed, thereby forming first photosensitive film patterns 207a.

Figure 4C:
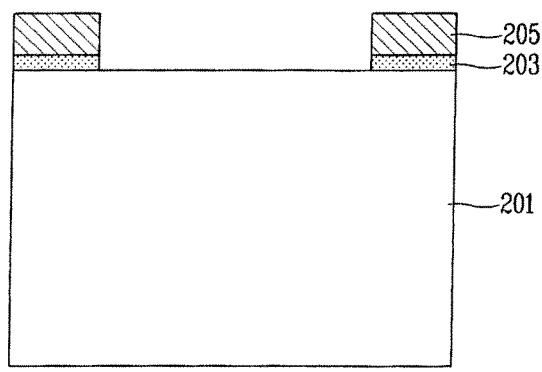

Referring to FIG. 4C, the pad silicon nitride 205 and the pad oxide 203 constructing a first hard mask are etched out by using the first photosensitive film patterns 207a as barrier layers, and thereafter the first photosensitive film patterns 207a are removed. Here, the etching is conducted down to the pad silicon nitride 205 and the pad oxide 203 constructing the first hard mask, so as to overcome the problem of a defective photosensitive film coating, which is caused when performing an etching process for forming a shallow trench after the etching process for forming the deep trench. That is, to define a shallow trench forming region through the first hard mask etching process and then perform the process of forming the shallow trench using the pad silicon nitride 205 constructing the first hard mask without a photolithography process after the etching process for forming the deep trench.

Figure 4D:
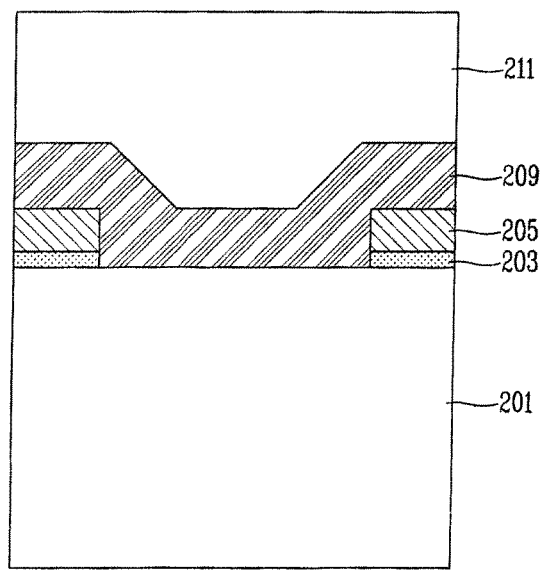

Referring to FIG. 4D, after removing the first photosensitive film patterns 207a, a second hard mask oxide 209 is deposited, in a thickness of about 0.5 to 1.5 μm, on the entire surface of the semiconductor substrate 201, including the exposed portions of the pad silicon nitride 205 and the pad oxide 203 constructing the first hard mask, through a chemical vapor deposition (CVD) having satisfactory gap-filling properties. Here, the second hard mask oxide 209 may be deposited to cover the tops of the pad silicon nitride 205 and the pad oxide 203 constructing the first hard mask, whereby the first hard mask can be protected upon forming the deep trench.

Afterwards, although not shown, a second photosensitive film 211 is coated on the second hard mask oxide 209.

Figure 4E:
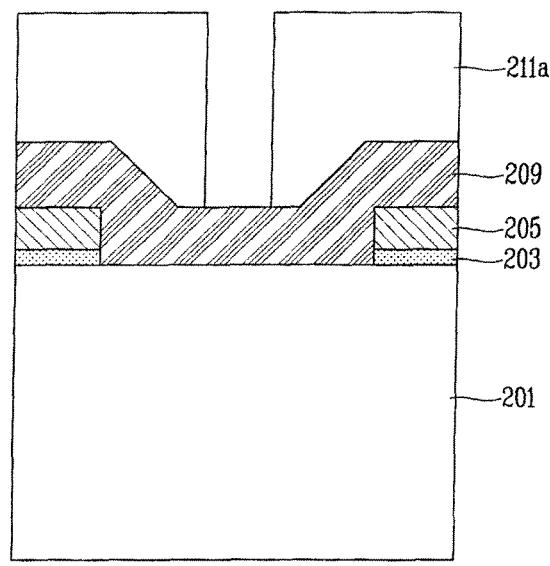

Referring to FIG. 4E, the second photosensitive film (not shown) is exposed for formation of deep trench and developed through a photolithography process using exposure masks (not shown), thereby forming second photosensitive film patterns 211a by removing the developed portion.

Figure 4F:
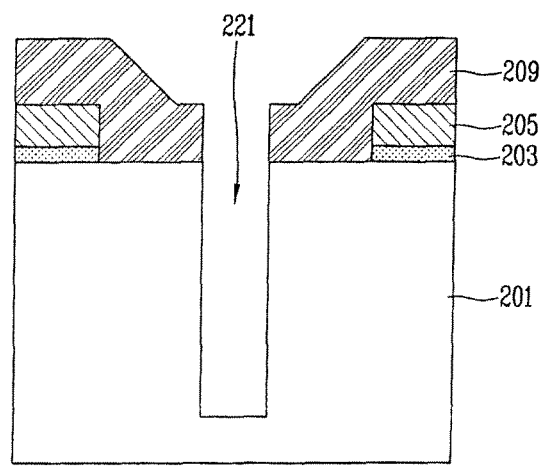

Referring to FIG. 4F, the second hard mask oxide 209 and the lower semiconductor substrate 201 are sequentially etched out by using the second photosensitive film patterns 211a, thereby forming a deep trench 221 in the semiconductor substrate 201. Here, the deep trench 221 may have a depth of about 1 to 20 μm. As shown in FIG. 4F, the undercut in the deep trench, may be generated from the top surface of the semiconductor substrate 201 to a depth of 4000 Å. Here, the undercut is formed to a round shape. While a top portion of the undercut has a negative slope, a lower portion of the undercut has a positive slope.

Figure 4G:
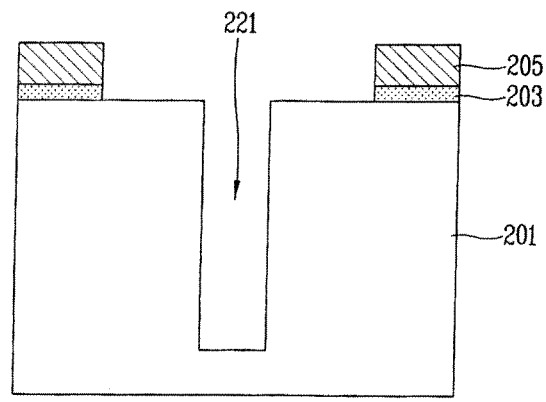

Referring to FIG. 4G, after removing the second photosensitive film patterns 211a, the second hard mask oxide 209 is etched out through a wet etching process. Here, only the pad silicon nitride 205 and the pad oxide 203 constructing the first hard mask are left on the semiconductor device 201.

Figure 4H:
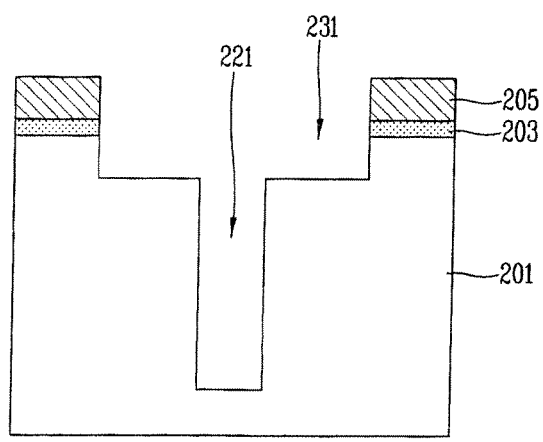

Referring to FIG. 4H, the semiconductor substrate 201 is selectively removed by using the pad silicon nitride 205 and the pad oxide 203 for the first hard mask as etching masks, thereby forming a shallow trench 231 overlapped with the deep trench 221. A depth of the shallow trench has a thickness of 3000 to 5000 Å.

As described in above, in forming the deep trench, the undercut is generated from the top surface of the semiconductor substrate 201 to the depth of 4000 Å.

If the depth of the shallow trench is more than 4000 Å, the formation of the shallow trench 231 may remove undercut existing from the top of the deep trench 221 down to about 4000 Å in depth and the resulting surface roughness of a sidewall of the deep trench 221. That is, while forming the deep trench 221, even if any undercut is generated on a top sidewall, the undercut can be completely removed through the process of forming the shallow trench 231.

If the shallow trench depth D is less than 4000 Å, an undercut having a negative slope is removed, and an undercut having a positive slope is only remained. This is because the undercut is formed from the top surface to the depth of 4000 Å, and the shallow trench depth D is smaller than the undercut depth so that the entire of the undercut is not removed. Because the undercut having the negative slope formed at a region close to a surface of the semiconductor substrate 101 is removed, it is out of the question in a process depositing for filling a gap. Because a part having the positive slope is remained, the gap fill may be rather better.

Also, while forming the shallow trench 231, a bottom of the deep trench 221 can be further etched out as deep as the depth of the shallow trench 231.

Also, since the existing process of coating the photosensitive film for forming the shallow trench after forming the deep trench is omitted, the problem of defective coating, such as a void, which is caused due to insufficient gap-filling within the deep trench when coating the photosensitive film by a spin coating in the related art, can be solved.

Figure 4I:
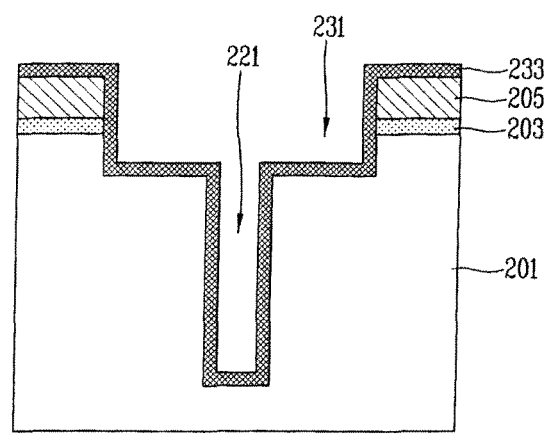

Referring to FIG. 4I, a nitride 233 is deposited, through a CVD method, on an entire surface of the substrate including the deep trench 221 and the shallow trench 231. Here, a sidewall oxide (not shown) may be formed for reduction of stress between the semiconductor substrate and the nitride material prior to the nitride deposition. The sidewall oxide may be grown by thermal oxidation.

Figure 4J:
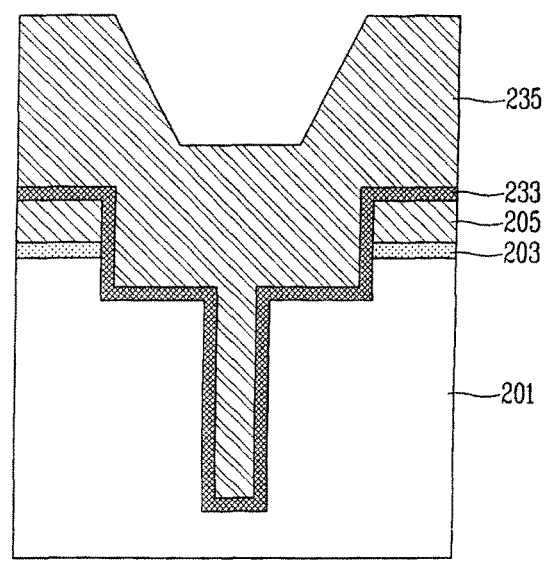

Referring to FIG. 4J, an oxide 235 is deposited on the nitride 233 through the CVD method having satisfactory gap-filling properties, thereby filling the deep trench 221 and the shallow trench 231. The CVD method for gap-filling includes one of high density plasma chemical vapor deposition (HDPCVD), low pressure chemical vapor deposition (LPCVD), plasma enhanced chemical vapor deposition (PECVD), and atmospheric pressure chemical vapor deposition (APCVD) methods. Therefore both the shallow trench region and deep trench region are filled with one of isolation layer of HDPCVD, LPCVD, PECVD and APCVD oxide.

Figure 4K:
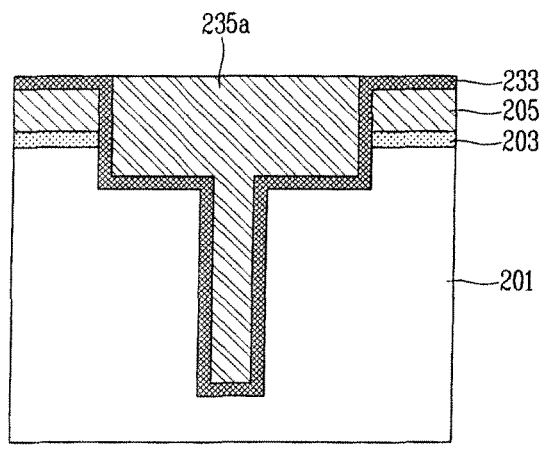
Figure 4L:
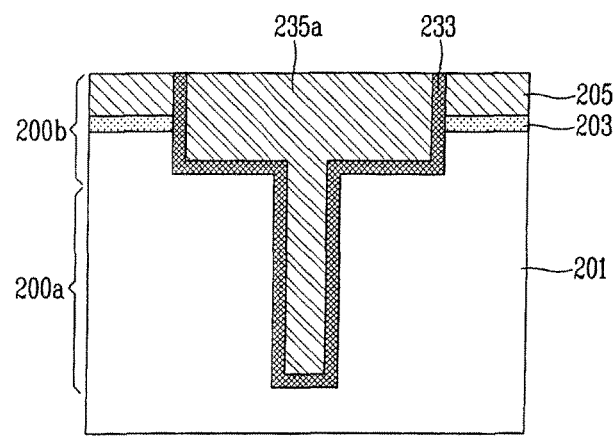

Referring to FIGS. 4K and 4L, the oxide 235 is planarized through a chemical mechanical polishing (CMP) process to form an oxide pattern 235a and the remaining first hard mask pad silicon nitride 205 is removed through a wet etching, thereby completing a process of forming the element isolation structure 200. Here, upon CMP process of the oxide 235, the CMP process of the nitride 233 can be suspended because the oxide and the nitride have different CMP removal rates. Here, the nitride 233 may be present at the sidewalls of a deep trench region 200a and a shallow trench region 200b constructing the element isolation structure 200 and the oxide pattern 235a may be filled in the sidewalls.

As described above, according to the element isolation structure of the semiconductor device and the method of forming the same, the poly stringers, which are caused due to separate formation of the shallow trench and the deep trench, can be minimized by forming the deep trench within the shallow trench.

Also, according to the element isolation structure of the semiconductor device and the method of forming the same, the shallow trench can be formed after forming the deep trench, thereby minimizing the undercut of the top of the deep trench upon forming the deep trench and resulting surface roughness of the trench sidewalls.

According to the element isolation structure of the semiconductor device and the method of forming the same, only the hard mask is etched out after completion of the element isolation structure forming process, and then the etching process for the deep trench is executed, thereby eliminating a defective coating of a photosensitive film, which is would otherwise result from forming the shallow trench after forming the deep trench.

Furthermore, according to the element isolation structure of the semiconductor device and the method of forming the same, the existing process of coating the photosensitive film for forming the shallow trench after forming the deep trench can be omitted, resulting in solving of a problem of a defective coating, such as a void, caused due to insufficient gap-filling within the deep trench when coating the photosensitive film by the existing spin coating.

In addition, according to the element isolation structure of the semiconductor device and the method of forming the same, since the process of forming the photosensitive film for forming the shallow trench can be omitted, a stable dual-depth trench having the deep trench and the shallow trench overlapped with the deep trench can be formed, thereby ensuring characteristics of stable isolation and operation of a high voltage device.

The foregoing embodiments and advantages are merely exemplary and are not to be construed as limiting the present disclosure. The present teachings can be readily applied to other types of semiconductor structures. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for forming an element isolation structure of a semiconductor device comprising:
   providing a semiconductor substrate having a top surface;
   forming a first hard mask on the semiconductor substrate;
   exposing the top surface of the semiconductor substrate by patterning the first hard mask, thereby forming a first opening with a first width, wherein no trench in the substrate is formed;
   forming a second hard mask on the exposed top surface of the semiconductor substrate;
   forming a deep trench region in the semiconductor substrate by patterning the second hard mask and the semiconductor substrate;

removing the patterned second hard mask;

forming a shallow trench region overlapped with the deep trench region by etching the semiconductor substrate through the first opening with the first width;

forming a side wall film and a first element isolation film in the deep trench region and the shallow trench region;

selectively removing the first element isolation film and the sidewall film in the shallow trench region such that a bottom surface of the shallow trench region is exposed, thereby forming a sidewall film pattern and a first element isolation film pattern within the deep trench region;

forming an oxide on the entire surface of the substrate including the shallow trench region; and forming a second element isolation film pattern contacted with the first element isolation film pattern by patterning the oxide.

2. The method of claim 1, wherein the first element isolation film comprises a polysilicon film.

3. The method of claim 1, wherein the first element isolation film comprises a chemical vapor deposition oxide film.

4. The method of claim 1, wherein the first hard mask comprises a pad oxide and a pad nitride.

5. The method of claim 1, wherein the second hard mask comprises an oxide layer.

6. The method of claim 1, wherein the deep trench region has a depth of 1 to 20 μm.

7. The method of claim 1, wherein the selectively removing the first element isolation film and the sidewall film in the shallow trench region comprising a polishing process of the first element isolation film.

8. The method of claim 7, wherein the sidewall film is used as an etch stop layer in the polishing process of the first element isolation film.

9. The method of claim 1, wherein the selectively removing the first element isolation film in the shallow trench region comprises:

removing the first element isolation film on the first mask;

performing an etch-back process over the first element isolation film; and removing the sidewall film through a wet etching.

10. The method of claim 9, wherein the sidewall film is used as an etch stop layer in the etch-back process.

11. The method of claim 1, wherein the patterning the second hard mask and the semiconductor substrate comprises:

forming a photosensitive film pattern on the second hard mask, thereby forming a second opening with a second width;

etching the second hard mask and the semiconductor substrate through the second opening by using the photosensitive film pattern as a mask.

12. The method of claim 1, wherein the removing the patterned second hard mask comprising completely removing the patterned second hard mask over the first hard mask and the silicon substrate such that the first opening is opened.

* * * * *